(12) United States Patent
Lee et al.

(10) Patent No.: US 7,666,690 B2
(45) Date of Patent: Feb. 23, 2010

(54) SYSTEM, APPARATUS AND METHOD OF SELECTIVE LASER REPAIR FOR METAL BUMPS OF SEMICONDUCTOR DEVICE STACK

(75) Inventors: Kang-Wook Lee, Suwon-si (KR); Se-Young Jeong, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/222,648

(22) Filed: Aug. 13, 2008

(65) Prior Publication Data

US 2008/0315242 A1 Dec. 25, 2008

Related U.S. Application Data

(62) Division of application No. 11/128,233, filed on May 13, 2005, now abandoned.

(30) Foreign Application Priority Data

May 14, 2004 (KR) ................... 2004-34166

(51) Int. Cl.
 *H01L 21/00* (2006.01)
(52) U.S. Cl. ............ 438/4; 438/6; 438/7; 438/15
(58) Field of Classification Search ......... 438/4, 438/6, 7, 15, 16
See application file for complete search history.

(56) References Cited

U.S. PATENT DOCUMENTS

| 5,012,502 | A | 4/1991 | Battin et al. |
| 5,034,591 | A | 7/1991 | Fang |
| 5,969,799 | A | 10/1999 | Sano |
| 6,441,339 | B1 | 8/2002 | Ueno |
| 2004/0072387 | A1* | 4/2004 | Hong et al. .......... 438/108 |

FOREIGN PATENT DOCUMENTS

| JP | 2002-016214 | 1/2002 |
| KR | JP 2002-016214 | 1/2002 |
| KR | 10-0325293 | 2/2002 |
| KR | JP 2003-309139 | 10/2003 |

* cited by examiner

*Primary Examiner*—Zandra Smith
*Assistant Examiner*—Christy L Novacek
(74) *Attorney, Agent, or Firm*—Harness, Dickey & Pierce, P.L.C.

(57) ABSTRACT

Exemplary embodiments of the selective laser repair apparatus and method may allow the repair of metal bumps in a semiconductor device stack by applying a laser beam to a damaged and/or defective bump. Metal bumps may be repaired and individual chips and/or packages forming a device stack need not be separated. The operation of a control unit and a driving unit may position a laser unit such that a laser beam may be irradiated at the damaged and/or defective metal bump. An X-ray inspection unit may obtain information about the damaged and/or defective metal bump.

8 Claims, 3 Drawing Sheets

SYSTEM, APPARATUS AND METHOD OF SELECTIVE LASER REPAIR FOR METAL BUMPS OF SEMICONDUCTOR DEVICE STACK

PRIORITY STATEMENT

This application is a divisional application of U.S. application Ser. No. 11/128,233, filed May 13, 2005 now abandoned, the entire contents of which are incorporated herein by reference, which claims the benefit under 35 U.S.C. §119 to Korean Patent Application No. 2004-34166 filed May 14, 2004, the entire contents of which are incorporated herein by reference.

BACKGROUND OF THE INVENTION

1. Field of the Invention

Exemplary embodiments of the present invention relate to a system, apparatus and method for repairing a damaged and/or defective metal bump in a semiconductor device stack.

2. Description of the Conventional Art

Semiconductor devices employed in various electronic devices may be driven by, for example, demands for increased functionality, increased capacity, and/or smaller form factor. Three-dimensional stack technology may satisfy these demands. A three-dimensional device stack may include individual chips and/or packages which may be stacked in layers and may use, for example, a metal bump bonding technique.

Metal bumps may be electrical connections within the device stack and/or between the stack and a board. The metal bumps may require, for example, a flux coating layer which may reduce oxidation of the surface. The flux layer on the metal bumps may be often damaged and/or defective by heat and/or pressure during fabrication of the device stack. An oxide layer on the metal bumps, which may result in one or more damaged and/or defective electrical connections. The metal bumps may also be damaged and/or defective by, for example, thermal-induced stress.

Damaged and/or defective metal bumps may be repaired and/or changed. In a conventional method heat may be applied to the stack such that the individual chips and/or packages may be separated from each other. Damaged and/or defective bumps may be repaired and/or changed, and a new device stack may be created. This conventional method may create problems such as device failure which may result from heat applied to the device, and/or the existence of non-removed residue of the damaged and/or defective bump. The wafer level chip stack packages may be simultaneously fabricated at the wafer level and a particular chip stack package may be difficult to repair after stacking.

A conventional device stack which may include damaged and/or defective bumps may be rejected without being repaired and/or changed. This may result in a lower yield and/or a higher cost of fabrication of final products.

SUMMARY OF THE INVENTION

Exemplary embodiments of the present invention may provide a system, apparatus and a method for selectively repairing a damaged and/or defective metal bump of a semiconductor device stack which may include a plurality of individual chips and/or packages connected by metal bumps, without separating the individual chips or packages in the device stack.

In an exemplary embodiment of the present invention, an apparatus may comprise a stage unit, on which the semiconductor device stack may be loaded and/or temporarily fixed to, a laser unit which may generate a laser beam and may selectively irradiating the laser beam at a damaged and/or defective metal bump in the semiconductor device stack, a driving unit which may be connected to the laser unit and may supply a force to the laser unit, and a control unit which may be connected to the laser unit and the driving unit and may control the laser unit and the driving unit according to a programmed procedure. The laser unit may be positioned such that the laser beam may be focused and irradiated at the damaged and/or defective metal bump.

In another exemplary embodiment of the present invention, the system may comprise an x-ray inspection unit, which may inspect the semiconductor device stack, a stage unit, on which the semiconductor device stack may be loaded and/or temporarily fixed to, a laser unit which may generate a laser beam and may selectively irradiating the laser beam at a damaged and/or defective metal bump in the semiconductor device stack, a driving unit which may be connected to the laser unit and may supply a force to the laser unit, and a control unit which may be connected to the laser unit and the driving unit and may control the laser unit and the driving unit according to a programmed procedure. The laser unit may be positioned such that the laser beam may be focused and irradiated at the damaged and/or defective metal bump.

In exemplary embodiments of the present invention, the laser unit may include a laser beam source which may generate the laser beam, and an optical system which may control a path of the laser beam and may convert the laser beam into the focused beam.

In exemplary embodiments of the present invention, the optical system may include at least one mirror which may reflect the laser beam and may control the path of the laser beam.

In exemplary embodiments of the present invention, the optical system may include at least one condensing lens which may convert the laser beam into the focused beam and may reduce a spot diameter of the focused beam. The optical system may also include a wavemeter which may receive the laser beam, measure the wavelength, and determine the depth of a focus (DOF) of the laser beam. The spot diameter of the focused beam may be in the range of 20 $\mu$m to 150 $\mu$m.

In exemplary embodiments of the present invention, the x-ray inspection unit may be adapted to apply x-rays to the semiconductor device stack, detect the angle of diffraction of the x-rays, determine information about the damaged and/or defective metal bump, and send the information to the control unit.

In exemplary embodiments of the present invention, the driving unit may be mechanically connected to the laser unit, and/or the control unit may be electrically connected to the laser unit and the driving unit.

In another exemplary embodiment of the present invention, the method may comprise loading a semiconductor device stack on a stage unit, generating a laser beam, selectively irradiating the laser beam at a metal bump in the semiconductor device stack when the laser beam may be focused on the metal bump, supplying a force to a laser unit, and controlling the laser unit and a driving unit according to a programmed procedure.

In another exemplary embodiment of the present invention, the method may comprise inspecting a semiconductor device stack, loading the semiconductor device stack on a stage unit, generating a laser beam, selectively irradiating the laser beam at a metal bump in the semiconductor device stack when the laser. beam may be focused on the metal bump, supplying a force to a laser unit, and controlling the laser unit and a driving unit according to a programmed procedure.

In another exemplary embodiment of the present invention, the method may comprise inspecting the device stack, identifying a damaged and/or defective metal bump, and repairing the damaged and/or defective metal bump by selectively irradiating a laser beam at the damaged and/or defective metal bump.

In exemplary embodiments of the present invention, the inspecting of the device stack may include applying X-rays to the device stack, detecting the diffraction angle of the X-rays, and obtaining information in connection with the damaged and/or defective metal bump.

In exemplary embodiments of the present invention, the laser beam may be a carbon dioxide (CO2) laser beam or a neodymium:yttrium aluminum garnet (Nd:YAG) laser beam, may have near-infrared wavelengths (for example, in the range of 0.7 μm to 1.2 μm), and may have a power in the range of 20 W to 70 W.

BRIEF DESCRIPTION OF THE DRAWINGS

It should be noted that these Figures are intended to illustrate the general characteristics of methods and devices of exemplary embodiments of this invention, for the purpose of the description of such exemplary embodiments herein. These drawings are not, however, to scale and may not precisely reflect the characteristics of any given embodiment, and should not be interpreted as defining or limiting the range of values or properties of exemplary embodiments

DETAILED DESCRIPTION OF EXEMPLARY EMBODIMENTS OF THE PRESENT INVENTION

Figure 1:
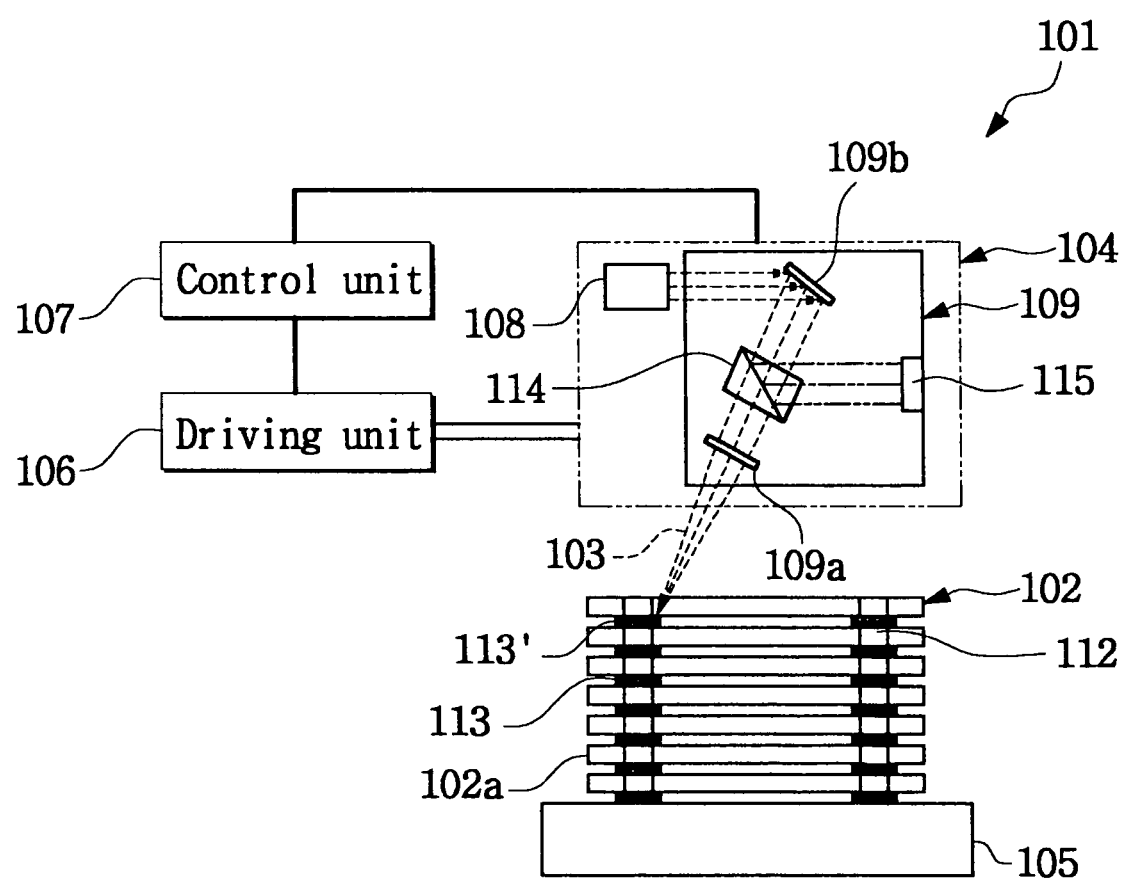
FIG. 1 is a schematic view showing an exemplary embodiment of an apparatus for selectively repairing a damaged and/or defective metal bump in a semiconductor device stack.

FIG. 1 is a schematic view illustrating an exemplary embodiment of an apparatus for selectively repairing a damaged and/or defective metal bump in a semiconductor device stack.

Referring to FIG. 1, the selective repair apparatus 101 may include a stage unit 105, a laser unit 104, a driving unit 106, and a control unit 107. A semiconductor device stack 102 may be loaded on and/or temporarily fixed to the stage unit 105. Loading and/or temporarily fixing of the device stack 102 may be well known in the conventional art and therefore a detailed description of the same may be omitted.

The device stack 102 may include a plurality of semiconductor chips 102a arranged in a stack. Each chip 102a may include internal conductive via 112. A plurality of metal bumps 113 may be interposed between adjacent lower and upper chips 102, and may provide mechanical and/or electrical connections between the via 112 of the adjacent chips 102a. The metal bumps 113 may include a damaged and/or defective bump 113'. The device stack 102 may be mounted on a board and may be encapsulated with a suitable material.

The laser unit 104 may selectively irradiate a laser beam 103 at the damaged and/or defective bump 113' of the device stack 102. The laser unit 104 may include a laser beam source 108 and an optical system 109.

The laser beam source 108 may generate the laser beam 103 (for example, a carbon dioxide ($CO_2$) laser beam, a neodymium yttrium aluminum garnet (Nd:YAG) laser beam, or the like). The laser beam source 108 may include a collimator lens (not shown) which may allow the laser beam 103 to be parallel.

The optical system 109 may control a path of and/or convert the laser beam 103 into a focused beam. The optical system 109 may include a mirror 109b, a beam splitter 114, and a condensing lens 109a. The mirror 109b may reflect the incident laser beam and may control the path of the laser beam 103. The beam splitter 114 may transmit at least a portion of the laser beam 103 and may reflect another portion (for example, the remaining portion) of the laser beam 103. The condensing lens 109a may convert the laser beam 103, which may pass through the beam splitter 114, to a focused beam 103, and may reduce a spot diameter of the focused beam 103. The spot diameter of the focused beam 103 may vary from 20 μm to 150 μm.

The condensing lens 109a may move along the path of the laser beam 103 and may alter the focal distance of the laser beam 103.

The optical system 109 may include a wavemeter 115 which may determine the depth of focus (DOF) of the laser beam 103. The wavemeter 115 may receive a laser beam, reflected by beam splitter 114, and may measure the wavelength of the reflected laser beam.

The DOF of the laser beam 103 may be obtained from a formula, $DOF=\lambda/(NA)^2$, where $\lambda$ may represent the wavelength of the laser beam, and NA may represent the numerical aperture. The number of apertures of the condensing lens 109a may be determined and the DOF of the laser beam 103 may be calculated by inserting the measured wavelength of the laser beam into the formula $DOF=\lambda/(NA)^2$.

The driving unit 106 may be connected (for example, mechanically) to the laser unit 104 and may supply a force to the laser unit 104 and/or internal elements such as the mirror 109b, the beam splitter 114, and/or the condensing lens 109a. The driving unit 106 may position the laser unit 104 such that the laser beam 103 may be irradiated, and the focus of the laser beam 103 directed, at a target, for example, a damaged and/or defective bump 113'.

The control unit 107 may be connected (for example, electrically connected) to the driving unit 106 and/or the laser unit 104 and may control one or both to perform a programmed procedure. The operation of the control unit 107 may cause the driving unit 106 to position the laser unit 104 such that the laser beam 103 may irradiate at the damaged and/or defective bump 113'. The control unit 107 may cause the driving unit 106 to adjust the focus of the laser beam 103 using the internal elements, for example, the mirror 109b, the beam splitter 114, and/or the condensing lens 109a. The control unit 107 may regulate the wavelength and/or power of the laser unit 104. The control unit 107 may cause the driving unit 106 to rotate the mirror 109b, such that an angle of reflection of the laser beam 103 may be altered, which may result in a modification of the path of the laser beam 103. The control unit 107 may cause the driving unit 106 to move the condensing lens 109a along the path of the laser beam 103, such that the spot diameter of the focused beam 103 may vary from 20 μm to 150 μm.

Figure 2:
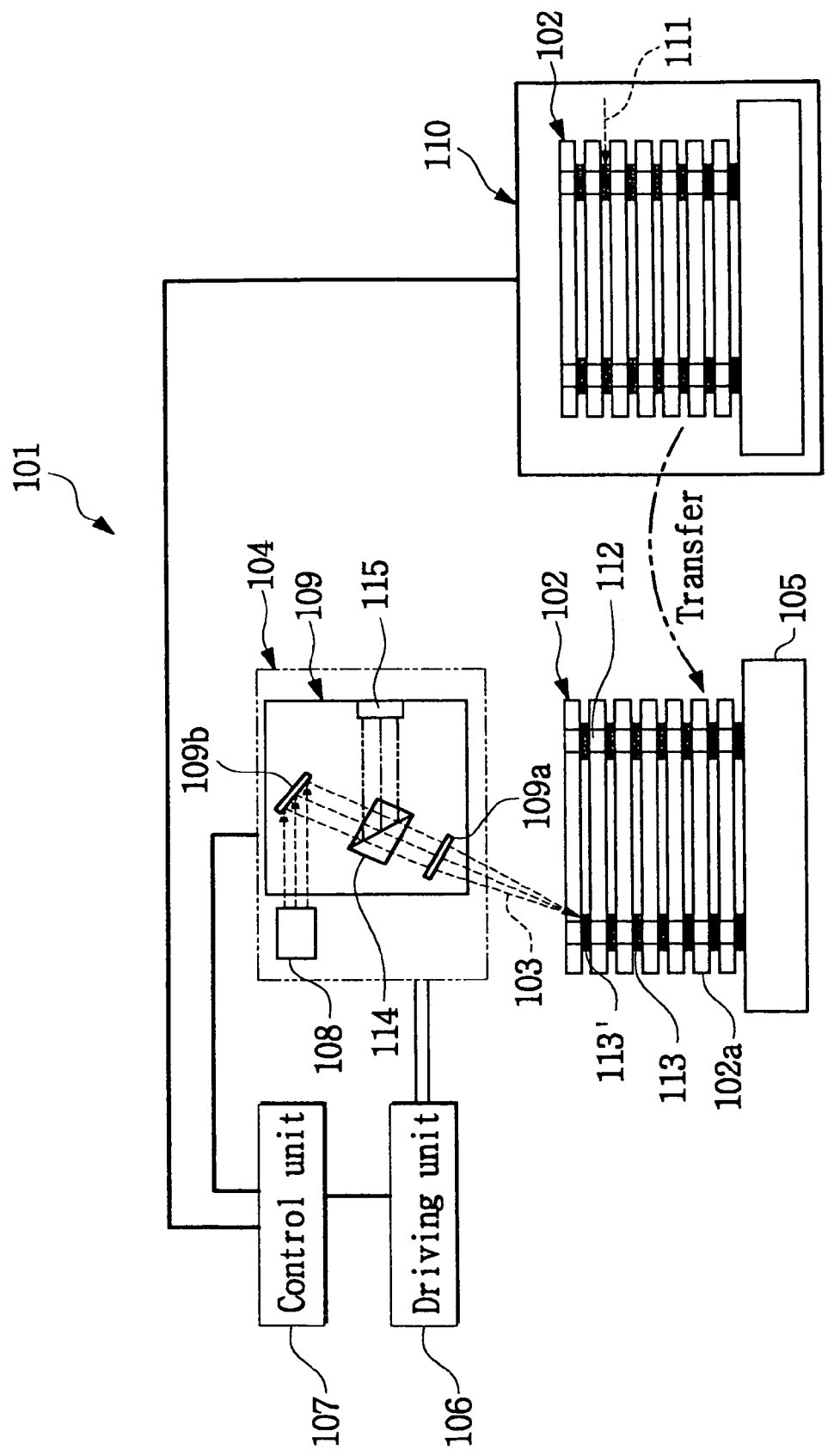
FIG. 2 is a schematic view showing an exemplary embodiment of a selective laser repair system which may include an X-ray inspection unit.

The control unit 107 may be connected (for example, electrically connected) to an X-ray inspection unit. FIG. 2 illustrates an exemplary embodiment of the selective laser repair apparatus 101 which may include the X-ray inspection unit 110.

Referring to FIG. 2, the X-ray inspection unit 110 may transmit information about the location of the damaged and/or defective bumps 113' to the control unit 107 and may establish process conditions and/or procedure.

The X-ray inspection unit 110 may apply X-rays 111 to the device stack 102 and may detect the angle of diffraction of the X-rays. The diffraction angle of the X-rays 111 may indicate the internal structures and/or characteristics of the device stack 102. Detection of the angle of the diffracted X-rays may provide information for the repairing the damaged and/or defective and/or defective bumps 113'.

The X-ray inspection unit 110 may include a generator (not shown) which may produce the X-rays 111, a goniometer (not shown) which may regulate an incident angle of the X-rays 111, and a detector (not shown) which may detect the diffracted X-rays. The generator, goniometer, and detector are well known in the art, and thus a detailed discussion may be omitted.

Figure 3:
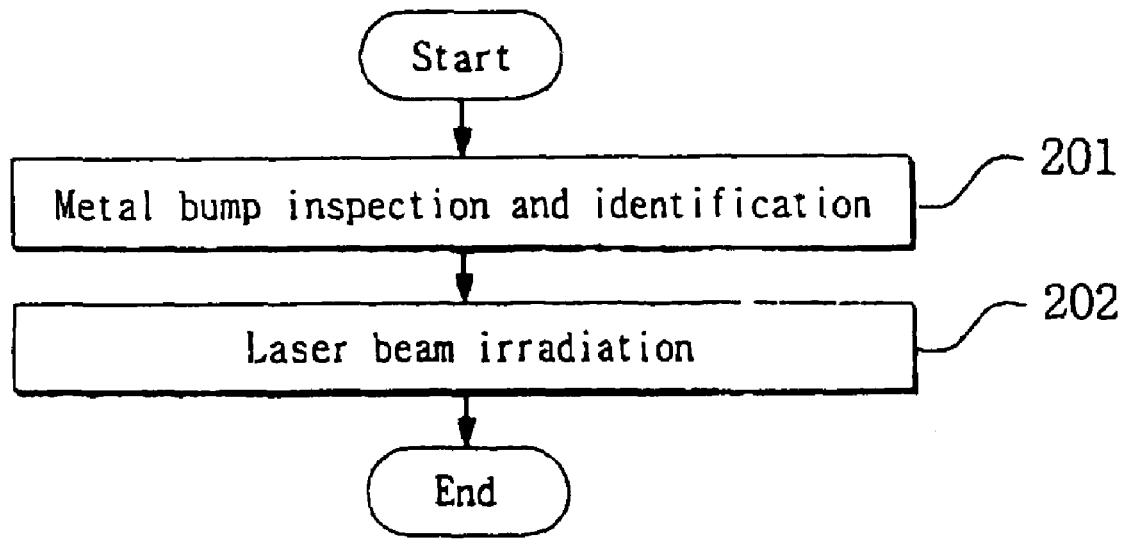
FIG. 3 is a flow chart showing an exemplary embodiment of a method for selectively repairing a damaged and/or defective metal bump of a semiconductor device stack.

FIG. 3 is a flow chart illustrating an exemplary embodiment of a method for selectively repairing a damaged and/or defective metal bump of a semiconductor device stack. Referring to FIG. 3, an exemplary embodiment of the selective laser repair method may be composed of steps 201 and 202. The device stack may inspected using the X-rays 111 and the damaged and/or defective metal bump 113 may be identified at 201. The damaged and/or defective bump 113' may be repaired 202 by selectively irradiating the laser beam 103.

The X-ray inspection unit 110 may apply X-rays 111 to the device stack 102. The X-rays 111 may be diffracted, depending upon the internal structures of the device stack 102. The diffracted X-rays may arrive at the detector of the X-ray inspection unit 110. The detector may detect the diffraction angle of the X-rays and may obtain information, such as locations, in connection with the damaged and/or defective bumps 113'.

The information, (for example, location information) may be transmitted to the control unit 107. The information may be transmitted through a direct line between the detector and the control unit 107 or may be displayed for human operator's review through the X-ray inspection unit 110, and the human operator may provide the information to the control unit 107.

In accordance with the information regarding the damaged and/or defective bumps 113', the control unit 107 may establish conditions, such as the wavelength, the power, the path, and/or the spot diameter of the laser beam 103, and/or processes and/or procedures, such as a course of the laser unit 104. The device stack 102 may be transferred to the stage unit 105 of the repairing apparatus 101 from the X-ray inspection unit 110.

The operation of the control unit 107 may cause the driving unit 106 to move the laser unit 104 to a position for irradiating the laser beam 103 at the damaged and/or defective bumps 113'. The laser beam source 108 may generate the laser beam 103, which may be irradiated at the damaged and/or defective bump 113' and may be controlled by the optical system 109.

The damaged and/or defective bump 113' may be melted and/or re-bonded to the conductive via 112 of the chip 102'. More specifically, the focus of the laser beam 103 may be placed on the damaged and/or defective bump 113', such that the laser beam 103 may penetrate the chip 102' and/or increase the temperature of the damaged and/or defective bump 113'. The oxide layer on the surface of the damaged and/or defective bump 113' may rapidly dissolve into the damaged and/or defective bump 113' and may be removed from the surface.

To reduce the probability of re-oxidation of the surface of the metal bumps 113, exemplary embodiments of the present invention may be performed in an atmosphere of inert gas such as argon, nitrogen gas, or the like. The laser beam 103 may have near-infrared wavelengths, for example, in the range of 0.7 µm to 1.2 µm, allowing penetration into the chip 102a. The laser beam 103 may have a power in the range of 20 W to 70 W.

After repairing the damaged and/or defective bump 113', the laser unit 104 may move along a course (for example, a programmed course) and may repair another damaged and/or defective bump 113'.

As discussed above, exemplary embodiments of the selective laser repair system, apparatus and method may allow local repairs of the metal bumps by applying the laser beam to a damaged and/or defective bump. Thus, individual chips and/or packages which may form the device stack need not be separated.

Exemplary embodiments of the laser repairing apparatus and method may be useful at the wafer level chip stack package. Exemplary embodiments of the present invention may improve the yield of the semiconductor device stack, and/or reduce the cost of fabrication.

Although exemplary embodiments of the present invention have been described as including a device stack 102 it will be understood that any other suitable type and/or number, of stacked chips and/or stacked packages, may be employed, as desired by one of ordinary skill in the art.

Although exemplary embodiments of the present invention have been described including an optical system 109 which may include a single mirror 109b and a single lens 109a, it will be understood that two or more mirrors and/or two or more lenses may be utilized as desired by one of ordinary skill in the art.

Although exemplary embodiments of the laser beam have been discussed with regard to a carbon dioxide ($CO_2$) laser beam, and a neodymium yttrium aluminum garnet (Nd:YAG) laser beam, it will be apparent that any suitable laser may be utilized as desired by one of ordinary skill in the art.

Although exemplary embodiments of the present invention have been discussed as having a spot diameter of the focused beam 103 which may vary from 20 µm to 150 µm, it will be apparent that any suitable spot diameter (either within or outside of the range of 20 µm to 150 µm) may be utilized as desired by one of ordinary skill in the art.

Although exemplary embodiments of the present invention have been described including the control unit 107 which may utilize the information regarding the damaged and/or defective bumps 113', and may establish conditions, such as the wavelength, the power, the path, and/or the spot diameter of the laser beam 103, and/or processes and/or procedures, such as a course of the laser unit 104, it will be apparent that any conditions, processes, and/or procedures, for configuring a laser beam may be utilized as desired by one of ordinary skill in the art.

Although exemplary embodiments of the present invention may be performed in an atmosphere of inert gas such as argon, nitrogen gas, it will be apparent that the exemplary embodiments of the present invention may be performed in any atmosphere as desired by one of ordinary skill in the art.

Although exemplary embodiments of the present invention have been described as including a laser beam, it will be understood that any other suitable focused source or focused heat source may be utilized as desired by one of ordinary skill in the art.

Although exemplary embodiments of the present invention may fix damaged and/or defective metal bumps, it will be understood that exemplary embodiments of the present invention may fix damaged and/or defective solder balls, bonding wires, electrode pads, etc., and/or any other irregularity, defect, and/or damage to components within a device stack.

Although exemplary embodiments of the present invention have been described as utilizing x-rays in the x-ray unit, it will be understood that any other suitable detector, which may include one or more suitable wavelengths of light, may be utilized as desired by one of ordinary skill in the art.

While this invention has been particularly shown and described with reference to some exemplary embodiments thereof, it will be understood by those skilled in the art that various changes in form and details may be made therein without departing from the spirit and scope of the invention as defined by the appended claims.

What is claimed is:

1. A method for selectively repairing metal bumps of a semiconductor device stack having a plurality of chips or packages connected by the metal bumps, the method comprising:
   inspecting the semiconductor device stack;
   identifying a damaged metal bump;
   irradiating a laser beam to penetrate the plurality of chips or packages;
   focusing the penetrated laser beam on the damaged metal bump; and
   adjusting the DOF (depth of focus) of the penetrated laser beam,
   wherein the DOF is calculated by the formula $DOF = \lambda(NA)^2$, $\lambda$ being the wavelength of the laser beam, and NA being the numerical aperture of condensing lens.

2. The method of claim 1, wherein the inspecting of the semiconductor device stack includes,
   applying X-rays to the device stack, and
   detecting the diffraction angle of the X-rays;
   obtaining information in connection with the damaged metal bump.

3. The method of claim 1, wherein the laser beam is a carbon dioxide ($CO_2$) laser beam or a neodymium: yttrium aluminum garnet (Nd:YAG) laser beam.

4. The method of claim 1, wherein the laser beam has a power in the range of 20 W to 70 W.

5. The method of claim 1, wherein adjusting the DOF further comprises:
   reflecting the laser beam by a beam splitter in the direction of a wavemeter; and
   measuring the wavelength of the reflected laser beam by the wavemeter.

6. The method of claim, wherein the method is performed in an atmosphere of inert gas including at least one of argon and nitrogen gas.

7. The method of claim 1, wherein the laser beam has near-infrared wavelengths.

8. The method of claim 7, wherein the wavelength of the laser beam is in the range of 0.7 μm to 1.2 μm.

* * * * *